US006905624B2

(12) United States Patent
Frum et al.

(10) Patent No.: US 6,905,624 B2
(45) Date of Patent: Jun. 14, 2005

(54) INTERFEROMETRIC ENDPOINT DETECTION IN A SUBSTRATE ETCHING PROCESS

(75) Inventors: Coriolan I. Frum, Los Gatos, CA (US); Zhifeng Sui, Fremont, CA (US); Hongqing Shan, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/615,159

(22) Filed: Jul. 7, 2003

(65) Prior Publication Data

US 2005/0006341 A1 Jan. 13, 2005

(51) Int. Cl.$^7$ .............................................. H01L 21/302
(52) U.S. Cl. ............................... 216/60; 216/67; 438/9; 438/16; 438/714
(58) Field of Search ...................... 216/60, 67; 438/9, 438/16, 714; 156/345.25, 345.43

(56) References Cited

U.S. PATENT DOCUMENTS

| | | |
|---|---|---|
| 3,612,692 A | 10/1971 | Kruppa et al. |
| 3,824,017 A | 7/1974 | Galyon |
| 3,874,797 A | 4/1975 | Kasai |
| 3,985,447 A | 10/1976 | Aspnes |
| 4,141,780 A | 2/1979 | Kleinknecht et al. |
| 4,147,435 A | 4/1979 | Habegger |
| 4,198,261 A | 4/1980 | Busta et al. |
| 4,208,240 A | 6/1980 | Latos |
| 4,317,698 A | 3/1982 | Christol et al. |
| 4,328,068 A | 5/1982 | Curtis |

(Continued)

FOREIGN PATENT DOCUMENTS

| | | |
|---|---|---|
| EP | 0511448 | 11/1992 |
| EP | 0709877 | 5/1996 |
| EP | 0753912 | 1/1997 |
| GB | 2293795 | 4/1996 |

OTHER PUBLICATIONS

Maynard, et al., "Multiwavelength Ellipsometry for Real–time Process Control of the Plasma Etching of Patterned Samples." *J. Vac Sci Technol. B*, 15(1), Jan./Feb. 1997, pp. 109–115.

Klemens, F.P., et al., "High Density Plasma Gate Etching of 0.12 μm Devices with Sub 1.5 nm Gate–Oxides." *Electrochemical Society Proceedings*, vol. 97–30, pp. 85–95.

PCT International Search Report dated Sep. 2, 1999.

European Search Report dated Sep. 4, 2001, P.B. 5818–Patentlaan 2, 2280 HV Rijswijk (ZH), The Hague.

*Primary Examiner*—George A. Goudreau
(74) *Attorney, Agent, or Firm*—Janah & Associates; Joseph Bach

(57) ABSTRACT

A method of etching a substrate includes placing a substrate in a process zone. The substrate has a material with a thickness, and the material has exposed regions between features of a patterned mask. An etchant gas is introduced into the process zone. The etchant gas is energized to etch the material. An endpoint of etching the material of the substrate is determined by (i) reflecting a light beam from the substrate, the light beam having a wavelength selected to have a coherence length in the substrate of from about 1.5 to about 4 times the thickness of the material, and (ii) detecting the reflected light beam to determine an endpoint of the substrate etching process. Additionally, the wavelength of the light beam can be selected to maximize an absorption differential that is a difference between the absorption of the light beam in the patterned mask and the absorption of the light beam in the material.

11 Claims, 8 Drawing Sheets

U.S. PATENT DOCUMENTS

| | | |
|---|---|---|
| 4,367,044 A | 1/1983 | Booth, Jr. et al. |
| 4,454,001 A | 6/1984 | Sternheim et al. |
| 4,611,919 A | 9/1986 | Brooks, Jr. et al. |
| 4,618,262 A | 10/1986 | Maydan et al. |
| 4,838,694 A | 6/1989 | Betz et al. |
| 4,846,928 A | 7/1989 | Dolins et al. |
| 4,847,792 A | 7/1989 | Barna et al. |
| 4,861,419 A | 8/1989 | Flinchbaugh et al. |
| 4,927,485 A | 5/1990 | Cheng et al. |
| 4,953,982 A | 9/1990 | Ebbing et al. |
| 4,972,072 A | 11/1990 | Hauser et al. |
| 5,131,752 A | 7/1992 | Yu et al. |
| 5,151,584 A | 9/1992 | Ebbing et al. |
| 5,362,356 A | 11/1994 | Schoenborn |
| 5,450,205 A | 9/1995 | Sawin et al. |
| 5,503,707 A | 4/1996 | Maung et al. |
| 5,564,830 A | 10/1996 | Bobel et al. |
| 5,578,161 A * | 11/1996 | Auda ............................ 438/9 |
| 5,658,418 A | 8/1997 | Coronel et al. |
| 5,681,424 A * | 10/1997 | Saito et al. ................. 438/716 |
| 5,756,400 A | 5/1998 | Ye et al. |
| 5,848,088 A * | 12/1998 | Mori et al. .................... 372/50 |
| 6,081,334 A | 6/2000 | Grimbergen et al. |
| 6,165,311 A | 12/2000 | Collins et al. |
| 6,559,942 B2 * | 5/2003 | Sui et al. ..................... 356/369 |

\* cited by examiner

INTERFEROMETRIC ENDPOINT DETECTION IN A SUBSTRATE ETCHING PROCESS

BACKGROUND

The present invention relates to the detection of an endpoint in the etching of a substrate.

In the processing of a substrate to fabricate electronic devices, such as electrical circuits and displays, etching processes are carried out to etch patterns in the substrate that correspond to layers or components of the electronic devices. For example, the patterns may comprise gates, vias, contact holes, or interconnect lines. Typically, a patterned mask of etch-resistant features comprising resist or hardmask is materials is formed on the substrate, and exposed areas of the substrate between the etch-resistant features are etched to form the patterns.

During the etching process, an endpoint detection method is used to evaluate and control the progress of etching through the dielectric layer, such as to stop or change the etching at a predetermined trench etch depth. In interferometric endpoint detection methods, as illustrated in FIG. 1 (Prior Art), a light beam 76 is directed onto the substrate 10 and a reflected light beam 78 emerges from the substrate 10. Constructive and destructive interference of portions of the reflected light beam 78 over time modulate the light beam 78 to form interference fringes, such as intensity maxima and minima. The reflected light beam 78 is detected by a detector that generates an interference signal, which is monitored to determine an endpoint of the etching process. When the reflection signal exhibits fringes that arise from the interference between a primary reflection 50 from the surface of the substrate 10 and reflections from the first couple of layers, such as from mainly the second layer 22. The interference fringes are used to measure the etch rate, the etch depth, and determine whether an etching process endpoint has been reached.

However, a portion 76b of the light beam 76 that is incident on the exposed areas 61 between the mask features 62 is partially transmitted to deep layers 23 below the first and second layers 30, 22, such as to third 23, or fourth (not shown) layers. The portions of the light beam 51–53 reflected from these deep layers 23 undesirably interferes with the primary reflection 50, adding noisy, redundant interference fringes to the reflected light beam 78 that make the meaningful interferences fringes in the reflection signal more difficult to identify. Another light beam portion 76a that is incident on the substrate 10 is reflected from the mask features 62, such as from the surface 17 of the mask 15 or even the layers 30, 22, 23 below the mask material. These extraneous reflections 40–44 also interfere with the reflected light beam 78 and add to the total reflection signal, decreasing the effective signal-to-noise ratio and possibly causing the indication of false endpoints.

As semiconductor devices are processed to be finer in scale, it is desirable to detect endpoint with higher precision and increased accuracy. The reflections 52, 53, 40–44 from the mask features 62 and deep layers 23 effectively limit the precision and accuracy of endpoint detection by adding noise to the reflection signal. This noise is sometimes removed using filters such as bandpass filters, which increase the complexity of endpoint detection and often do not entirely remove the noise. In order to etch shallower trenches, and etch trenches to a more exact depth, it would be desirable to have an endpoint detector capable of a higher precision. In conventional interferometric endpoint detectors, the noise that is added to the reflection signal degrades the ability to detect endpoint. For example, some conventional interferometric endpoint detectors have a minimum detectable depth of about 320 nm of a trench being etched.

Thus, it is desirable to interferometrically detect the endpoint of a substrate processing step to a higher precision. It is also desirable to interferometrically detect endpoint with less susceptibility to false endpoints, and thus improved accuracy.

SUMMARY

A method of etching a substrate comprises placing a substrate in a process zone. The substrate comprises a material having a thickness. An etchant gas is introduced into the process zone. The etchant gas is energized to etch the material. An endpoint of etching the material is determined by (i) reflecting a light beam from the substrate, the light beam having a wavelength selected to have a coherence length in the substrate of from about 1.5 to about 4 times the thickness of the material, and (ii) detecting the reflected light beam to determine an endpoint of the substrate etching process.

In another method of etching the substrate, the material of the substrate has exposed regions between features of a patterned mask. The endpoint of etching the material is determined by (i) reflecting a light beam from the substrate, the light beam having a wavelength selected to maximize an absorption differential that is a difference between the absorption of the light beam in the patterned mask and the absorption of the light beam in the material, and (ii) detecting the reflected light beam to determine an endpoint of the substrate etching process.

An apparatus for etching a substrate comprises a chamber with a substrate support to hold the substrate. A gas distributor introduces an etchant gas into the chamber. A gas energizer energizes the etchant gas to etch the material of the substrate. A light beam source reflects a light beam from the substrate, and the light beam has a wavelength selected to have a coherence length in the substrate of from about 1.5 to about 4 times the thickness of the material. A light detector detects the reflected light beam and generates a signal in response to a measured intensity of the reflected light beam. A controller evaluates the signal to determine an endpoint of the substrate etching process.

In another apparatus for etching the substrate the substrate comprises a material with exposed regions between features of a patterned mask. A light beam source reflects a light beam from the substrate, and the light beam has a wavelength selected to maximize an absorption differential that is a difference between the absorption of the light beam in the patterned mask and the absorption of the light beam in the material.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

An endpoint detection system is useful in the fabrication of integrated circuits on substrates and is particularly useful in the etching of dielectric, semiconductor, or conductor materials on the substrate. Dielectric and semiconductor materials are often layered on one another and make it difficult, for example, to etch through a thick overlying dielectric material while still stopping the etching process without etching through a thin underlying semiconductor material. The dielectric materials may include, for example, low-k dielectrics; and the semiconductor materials may include, for example, polysilicon or silicon. However, the present invention can be used in other processes such as evaporation, and should not be limited to the examples provided herein.

Figure 1:
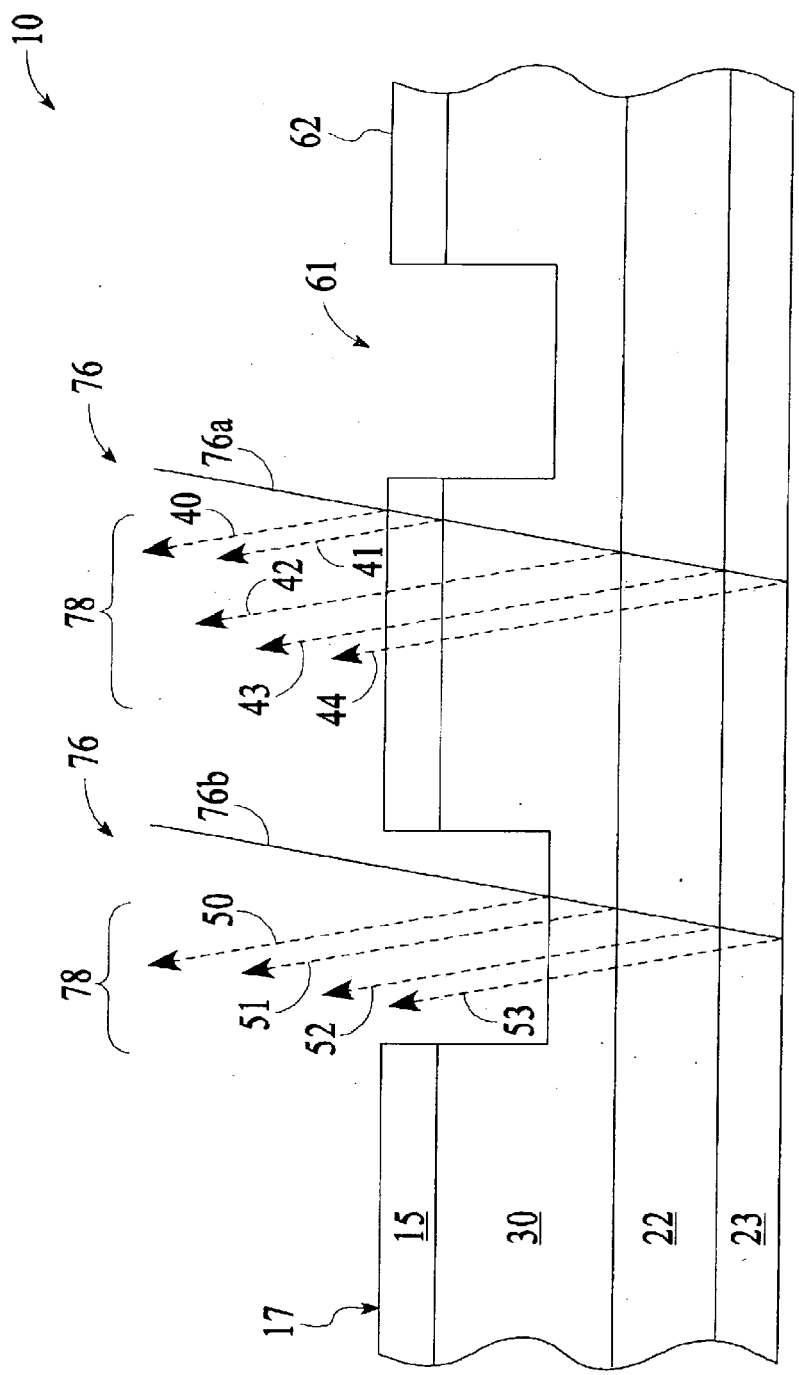
FIG. 1 (Prior Art) is a schematic sectional side view of a substrate upon which a conventional light beam is being directed, and from which the light beam is being reflected.
Figure 2:
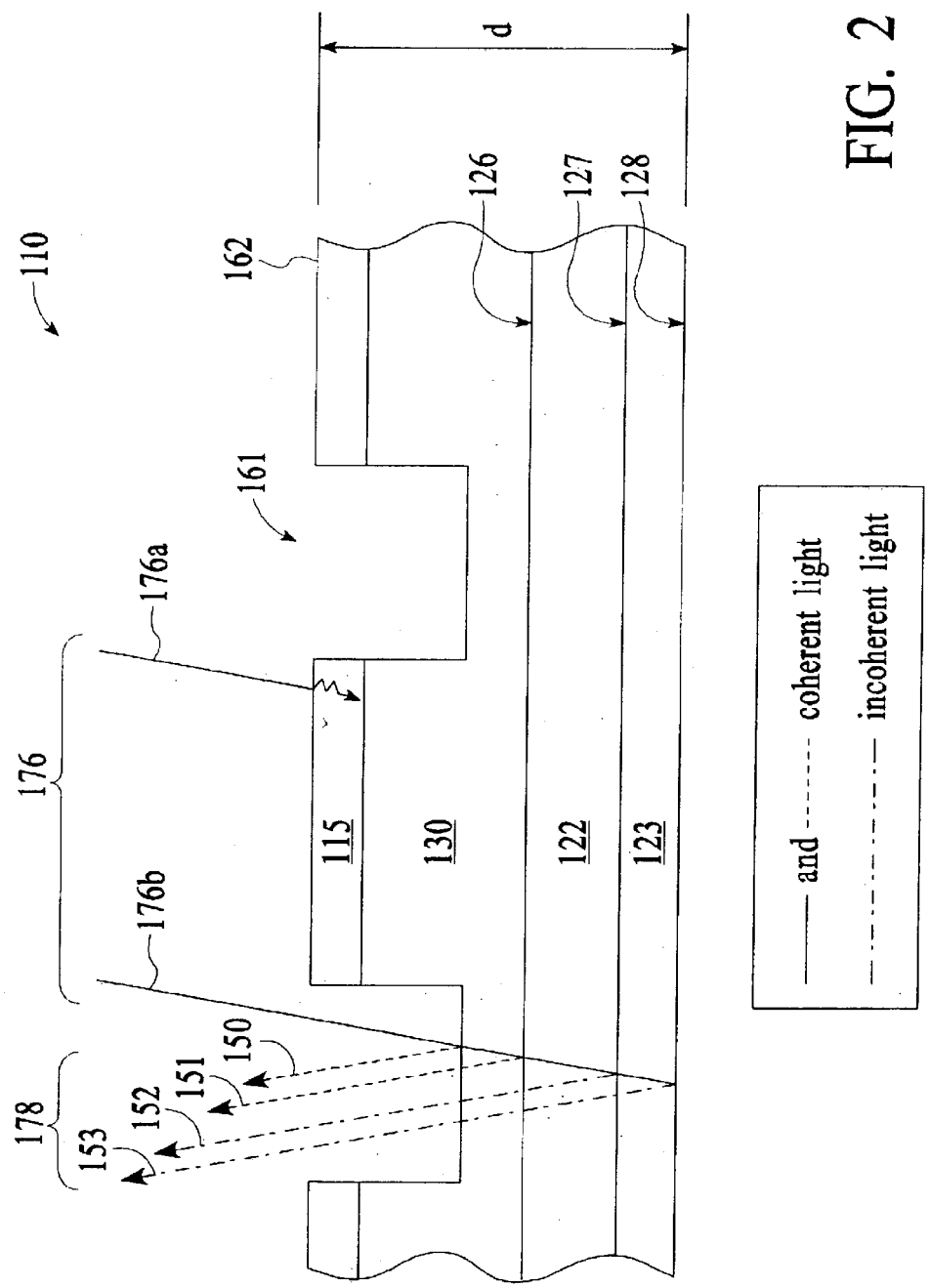
FIG. 2 is a schematic sectional side view of a substrate upon which a light beam according to the present invention is being directed, and from which the light beam is being reflected.

The substrate 110 shown in FIG. 2 is an exemplary illustrative embodiment of a substrate that may be etched using the present process, and is not intended to be limiting. The substrate 110 comprises a patterned mask 115, such as a patterned mask 115 comprising photoresist and/or hard mask (typically silicon oxide or silicon nitride) features 162 that are formed by lithographic methods. Between the mask features 162 are exposed regions 161 of the underlying materials of the substrate 110 that are open for etching. In the etching of dielectric materials, the mask 115 typically comprises photoresist. At the exposed regions 161, below the plane of the mask 115, the substrate 110 also comprises a first material 130 to be etched and an underlying material 122 below the first material 130. For example, the first material 130 may be a dielectric material such as a low-k dielectric. An exemplary underlying material 122 comprises a thin silicon dioxide material having a thickness of from about 10 to about 300 nanometers.

An example of an endpoint detection method for substrate etching according to the present invention will now be described in which the first material 130 is etched and the endpoint is detected with high accuracy and precision, thus avoiding undesirably etching or damaging the underlying material 122. As illustrated in FIG. 2, a light beam 176 having a selected wavelength is focused on the substrate 110 during the etching process and the intensity of the reflected light beam 178 is measured. The various reflections 150–153 of the light beam 176 constructively or destructively interfere to produce a reflected light beam 178 with a rapidly modulating intensity as etching progresses, and the modulating intensity is monitored to indicate the endpoint.

In one version, the wavelength of the light beam 176 is selected to have a limited coherence length (d) in the substrate 110 to reduce noise in the intensity signal 210 of the reflected light beam 178. While propagating through the substrate 110 within the coherence length (d), the light beam 176 maintains a defined phase such that the separately reflected portions 150, 151 of the light beam 176 within the coherence length can interfere with each other to create interference fringes. In FIG. 2, the coherent light is shown by the solid and dashed lines.

However, as the initially coherent light beam 176 propagates through its path in the substrate 110, the light beam 176 progressively loses its coherence because of self-interference of the light beam 176 as well as absorption and re-emission by the substrate material. After propagating farther than the coherence length, the light beam 176 becomes incoherent, as shown by the alternating dotted-dashed lines in FIG. 2. The incoherent reflections 152, 153 do not substantially modulate the intensity of the entire reflected beam 178 over time. In other words, after a portion of the light beam 176 propagates in the substrate 110 beyond the coherence length, that portion of the light beam 176 loses its defined phase such that interference between reflected portions of the light beam 176 substantially does not occur. The coherence length (d) may be approximated by the following proportionality:

$$d \propto \frac{\lambda^2}{\Delta\lambda}$$

where $\lambda$ is the wavelength whose coherence is being considered and $\Delta\lambda$ is the bandwidth of wavelengths of the light beam 176. The wavelength $\lambda$ of the light beam 176 in the first material 130 is inversely proportional to the refractive index of the first material 130.

The wavelength selection may comprise a particular wavelength or a particular wavelength bandwidth to limit the coherence length in the substrate 110. For example, to decrease the coherence length (d), a particular wavelength $\lambda$ that is being detected may be chosen to be smaller in order to decrease the nominator $\lambda^2$ in the above equation. Alternatively, the wavelength bandwidth $\Delta\lambda$ in the denominator may be increased to decrease the coherence length (d). Sometimes, the wavelength selection involves adjusting both the particular wavelengths $\lambda$ used and the bandwidth of the wavelengths ($\Delta\lambda$). In one embodiment, a wavelength is selected such that the coherence length of the light beam 176 is from about 1.5 to about 4 times a thickness of the first material 130, or even from about 2 to about 3 times the thickness of the first material 130, as shown in FIG. 2.

Additionally or alternatively, the wavelength of the light beam 176 may be selected such that a first portion 176a of the light beam 176 that impinges on the features 162 of the mask 115 is substantially entirely absorbed in the mask 115. If this first portion 176a of light were reflected from the mask 115, it would result in redundant interference fringes in the reflection signal that would obscure the endpoint from being accurately and precisely detected.

However, it is also important that a second portion 176b of the light beam 176 be substantially transmitted back and forth through the first material 130. The second portion 176b of the incident light beam 176 enters exposed regions 161 of the substrate 110 that are being etched to generate an etch signal, and is partially reflected. The second portion 176b of the ultraviolet light beam 176 passes through the first material 130 and reflects back from the substrate 110 with a beneficially increased ratio of intensity of reflection from the first material 130 to intensity of reflection from the mask 115. A first fraction 151 of the second portion 176b passes through the first material 130 and is reflected from the interface 126 between the first material 130 and a first underlying material 122. A second fraction 152 of the second portion 176b passes through the dielectric material 130 and the first underlying material 122, and then is reflected from the interface 127 between the first underlying material 122 and a deep second underlying material 123. A third fraction 153 of the second portion 176b passes through the first material 130, the first underlying material 122, the deep second underlying material 123, and then is reflected from the bottom 128 of the deep second underlying material 123.

For example, the mask 115 may have a known absorption coefficient ($\alpha$) that is the inverse of the depth of penetration of the light beam 176 into the first material 130, the penetration depth at which the intensity of the light beam 176 has decreased by a factor of 1/e. The absorption coefficient is a function of wavelength, and can be plotted as a curve, with local maxima that look like upward peaks in the curve representing optimal wavelengths at which to increase or decrease absorption. By considering this absorption coefficient, the thickness of the mask 115, and the absorption coefficient of the first material 130, the wavelength of the light beam 176 is selected to maximize an absorption differential ($\Delta\alpha=\alpha_{mask}-\alpha_{first\ material}$) that is a difference between absorption of the light beam 176 in the mask 115 ($\alpha_{mask}$) and absorption of the light beam 176 in the first material 130 ($\alpha_{first\ material}$). In one embodiment, the absorption coefficient of the mask 115 is selected such that the absorption length ($1/\alpha$) is less than about 1 micron. The light beam 176 is substantially absorbed by about a 1 micron depth into a mask 115 that has a thickness of at least about 1 micron.

Figure 6:
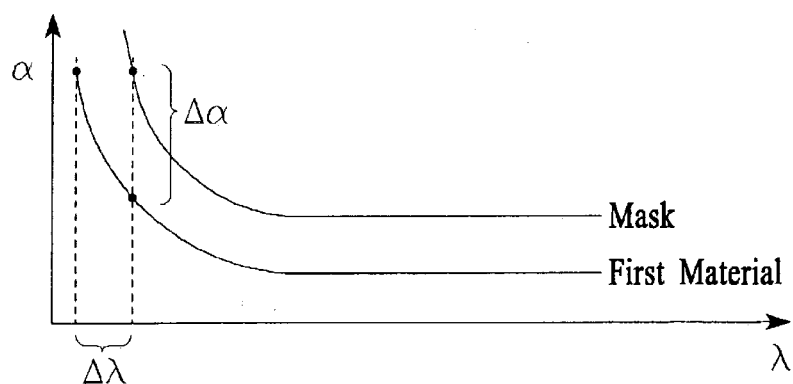
FIG. 6 is a plot showing the absorption coefficients ($\alpha$) of a mask and a dielectric layer as functions of a wavelength ($\lambda$) of a light beam being directed thereon.

FIG. 6 is a plot of absorption coefficient ($\alpha$) as a function of wavelength ($\lambda$). As discussed above, the coherence length (d) of the light beam 176 is inversely proportional to its wavelength bandwidth ($\Delta\lambda$). In an optimal solution, the differential ($\Delta\alpha$) between the absorption coefficient in the mask 115 and the absorption coefficient in the first material 130 is maximized under the constraints of a wavelength bandwidth ($\Delta\lambda$) that provides a desirable coherence length (d), such as from about 1.5 to about 4 times the thickness of the first material 130, or even from about 2 to about 3 times this thickness.

The reflectance or absorption of certain selected wavelengths in the mask 115 and the first material 130 may be determined early during the substrate processing, such as before the first stage of endpoint detection described above. For example, this calibration step may generate a reflectance or absorption "snapshot" for each substrate 110 at the ultraviolet wavelengths of the light beam 176 used in determining the endpoint. A broadband spectrum of light, such as a broadband flash of light, is directed at the substrate 110. Light that is reflected from the substrate 110 is detected to determine the absorption and reflection characteristics of that particular substrate 110.

Figure 3:
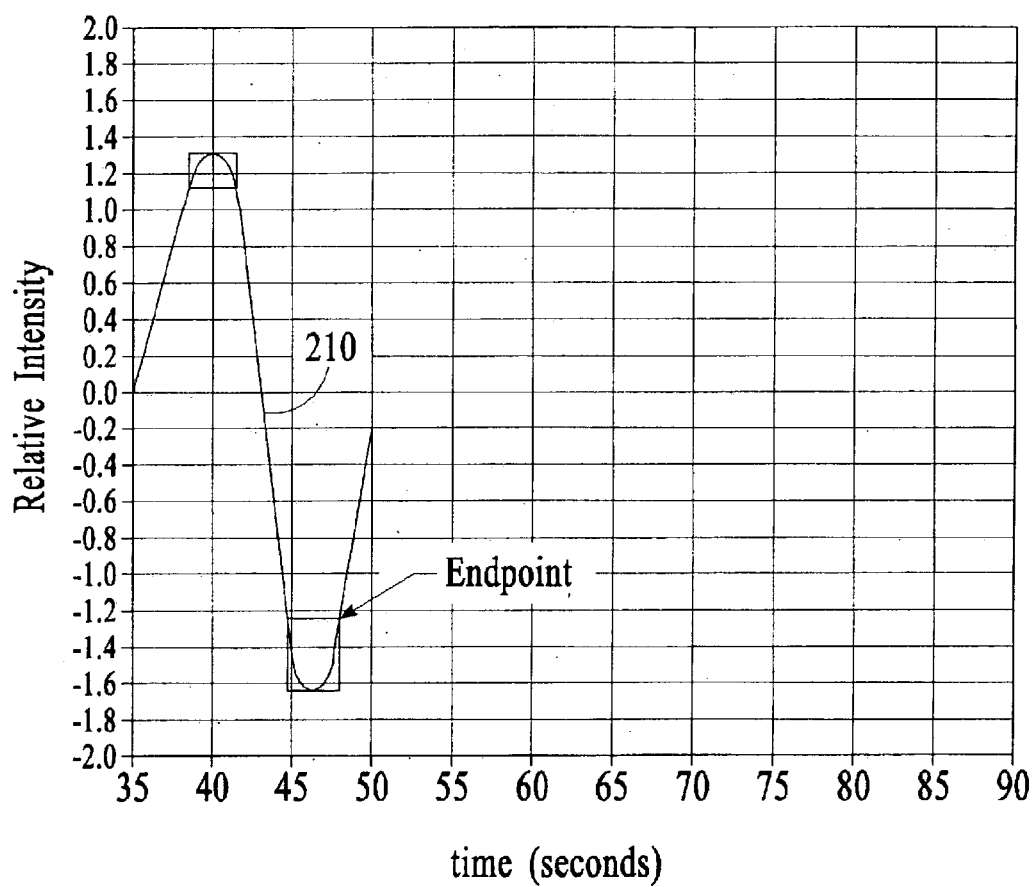
FIG. 3 is a plot of an intensity signal over time corresponding to a reflected light beam having a wavelength of about 254 nm.

FIG. 3 is a plot of relative intensity of the reflection signal as a function of time elapsed in seconds for a light beam 76 having a wavelength of about 254 nm. In this illustrative embodiment, the first material 30 is a low-k dielectric with an index of refraction (n) of about 1.47. The peak-to-peak distance in the interference signal is $d_{pp}=\lambda/(2n)$, where $\lambda$ is the wavelength of the light beam 76 and n is the index of refraction of the first material 30. In this example, $d_{pp}$ is calculated to be about 86.4 nm. The light beam 76 is substantially unabsorbed by the mask 15, and therefore undesirable reflections are present in the total reflected light beam 78. Typically, the reflected light beam 78 is received and converted into an electronic signal, and signal processing is used to purge the contribution of the undesirable reflections from the electronic signal. For example, the electronic signal may contain interference components that are due to shifting phase between a trench reflection 50 and mask reflections 44. Additionally, if the mask 15 is being partially etched and thickness of the mask 15 is therefore decreasing, shifting phase may occur between a reflection 40 from the surface of the mask 15 and a reflection from beneath the mask 41–44 to contribute a low-frequency interference component. A digital signal processor (DSP) can be used to perform signal processing to remove these undesirable interference components, but the signal processing consumes time during which the electronic signal cannot typically be monitored for the presence of indicators of an endpoint. Therefore, the minimum duration within which endpoint can be called is limited by both the time requirements of the digital signal processor and the wavelength of the light beam 76. In this example, the signal processing may take about 35 seconds to produce a "clean" electronic signal, and then about 13 seconds may elapse before an endpoint can be detected. This lag time sums to about 48 seconds, which corresponds to about 3200 Angstroms of etching. Therefore, the etch depth is lower limited to about 3200 Angstroms.

Figure 4:
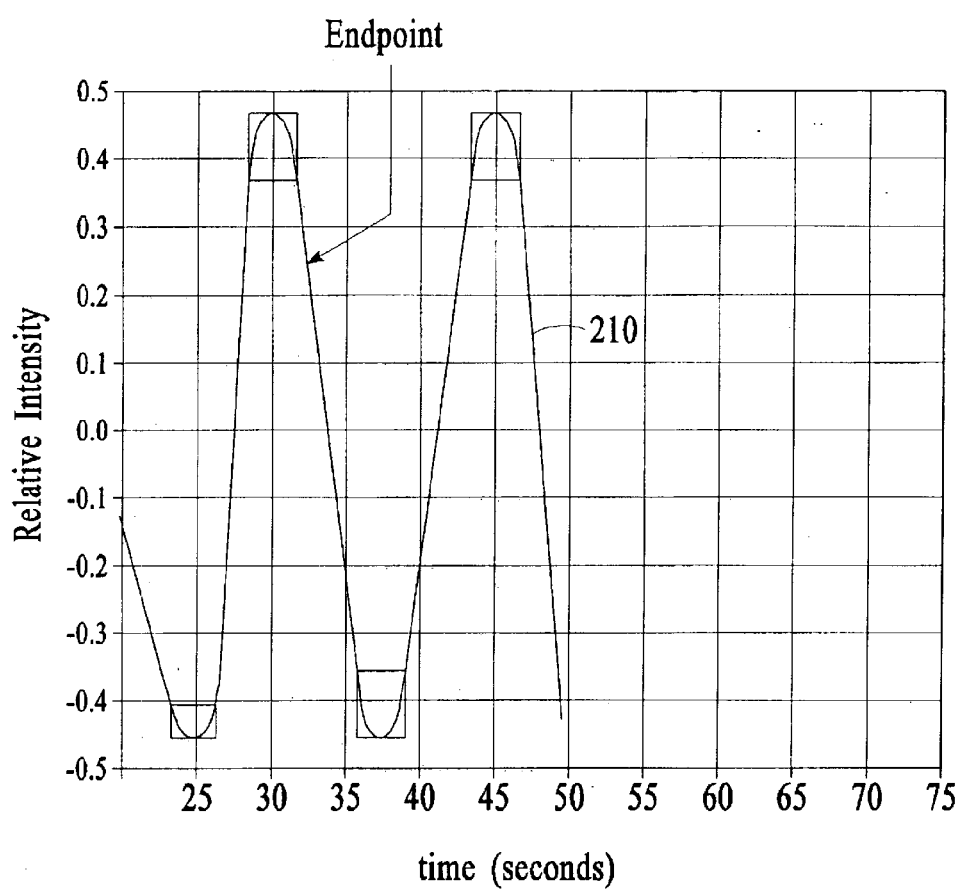
FIG. 4 is a plot of an intensity signal over time corresponding to a reflected light beam having a wavelength of less than about 220 nm.

In comparison with FIG. 3, FIG. 4 is a plot of relative intensity of the reflection signal as a function of time elapsed in seconds for a light beam 176 having a wavelength of less than about 220 nm. The material of the mask 115 is substantially absorbent to the light beam 176 at this wavelength, and therefore a higher signal-to-noise ratio is obtained. With the higher signal to noise ratio, little or no signal processing may be needed. In the example illustrated, the signal processing takes about 20 seconds, and 12 seconds later the minimum endpoint can be called where the etching process has reached a desirably smaller etch depth of about 1800 Angstroms.

Figure 5:
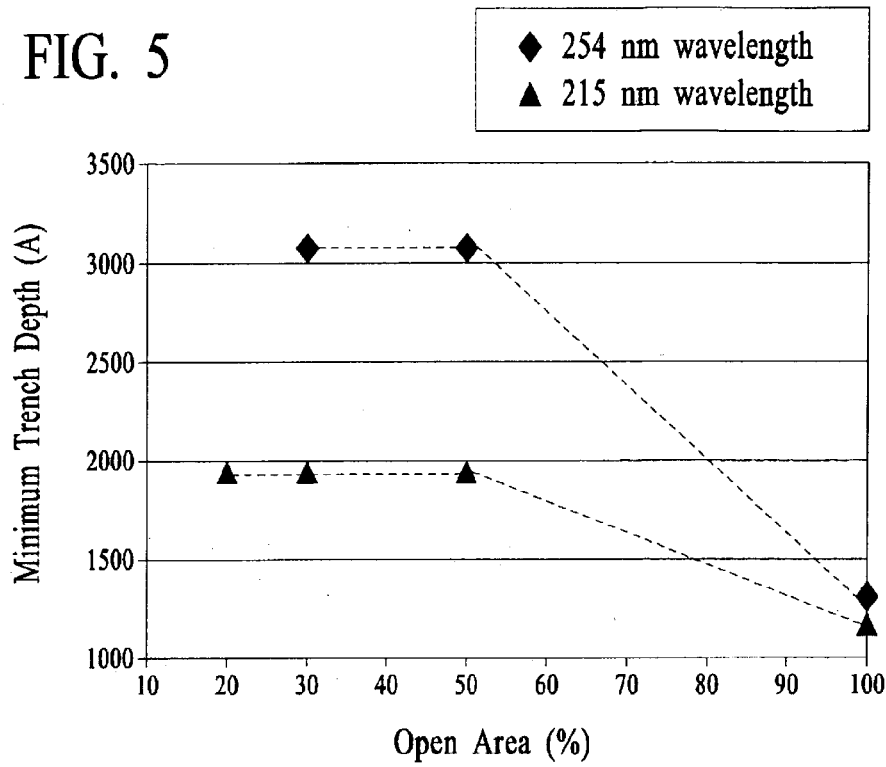
FIG. 5 is a plot showing a minimum etch depth achievable using a light beam with a wavelength of about 254 nm, and a minimum etch depth achievable using a light beam with a wavelength of less than about 220 nm, both as functions of percentage of the exposed area between the mask features.

A comparison of the minimum trench depths at which endpoint can be identified, in a conventional longer wavelength endpoint detection system (diamond line, 254 nm wavelength) and a shorter wavelength endpoint detection system according to the present invention (triangle line, 215 nm wavelength), are illustrated in FIG. 5. The plot shows minimum trench depth in angstroms (Å) as a function of exposed area as a percentage of total area of the substrate 110. As the exposed area increases, reflections from the features 162 of the mask 115 diminish and both methods improve in precision. However, at typical percentages of exposed area the shorter wavelength demonstrates a marked improvement in precision over the longer wavelength. For example, for an exposed area of less than about 50%, the minimum detectable trench depth using the 254 nm light beam is about 3100 Angstroms, which is equivalent to about 310 nm. In contrast, the minimum detectable trench depth using the 215 nm light beam is less than about 1900 Angstroms, which is equivalent to less than about 190 nm.

Thus, it is desirable to increase absorption of the light beam 176 in the mask 115 while maintaining a low absorption of the light beam 176 in the first material 130. The wavelength is preferably selected to be less than about 240 nm to improve absorption of the light beam 176 in the mask 115 while maintaining a low absorption of the light beam 176 in the first material 130. For example, the wavelength may be selected to be less than about 240 nm, or even from about 150 to about 220 nm, to optimize the respective absorptions of the light beam 176. These wavelength selections also particularly improve signal-to-noise ratio by removing interference between the primary reflection 150 and undesirable reflections 153 from deep layers 123. For example, these wavelengths may lie approximately in the center of the wavelength bandwidth in the light beam 176.

The etching and endpoint detection method of the present invention can significantly improve substrate yields by improving the precision of endpoint detection in the time dimension, thereby reducing etching or other damage of the layer 122, 123 underlying the dielectric layer 130, such as when the underlying layer 122 is a thin gate oxide layer during etching of a low-k dielectric layer 130. For example, a minimum detectable trench depth of less than about 200 nm can often be achieved. Additionally, the minimum detectable exposed area 161 is reduced. By decreasing the coherence length of the light beam 176 in the substrate 110 and increasing absorption of the light beam 176 in the mask 115, extraneous and noisy interference fringes are removed, thus improving the accuracy of endpoint detection. By stopping the etching process before the underlying layer 122 is damaged by the aggressive etching process step, the present endpoint detection method provides higher yields and better quality of integrated circuits.

The endpoint is typically detected by counting a number of interference fringes in the intensity signal 210 of the reflected light beam 178, the interference fringes being periodic points in the intensity signal 210, such as local minima or maxima where the derivative of the intensity signal 210 is approximately zero. For example, the endpoint may be detected by counting a sequence of maxima, or alternatively by counting a sequence of minima. Fractional fringes can be counted according to the estimated time until the next periodic point based on the shape of the signal waveform. The number of interference cycles in the modulation of the combined ultraviolet light beam 178 reflected from the substrate 110 is about $d(2\,n/\lambda_0)$, where n is the refractive index of the first material 130, d is the etch depth, and $\lambda_0$ is the vacuum wavelength of the light beam 176. Once a predetermined number of interference fringes are counted, the etching endpoint is determined to have occurred or be near. Alternatively, the endpoint may be detected by comparing the reflection intensity signal 210 to an expected intensity pattern.

Figure 7:
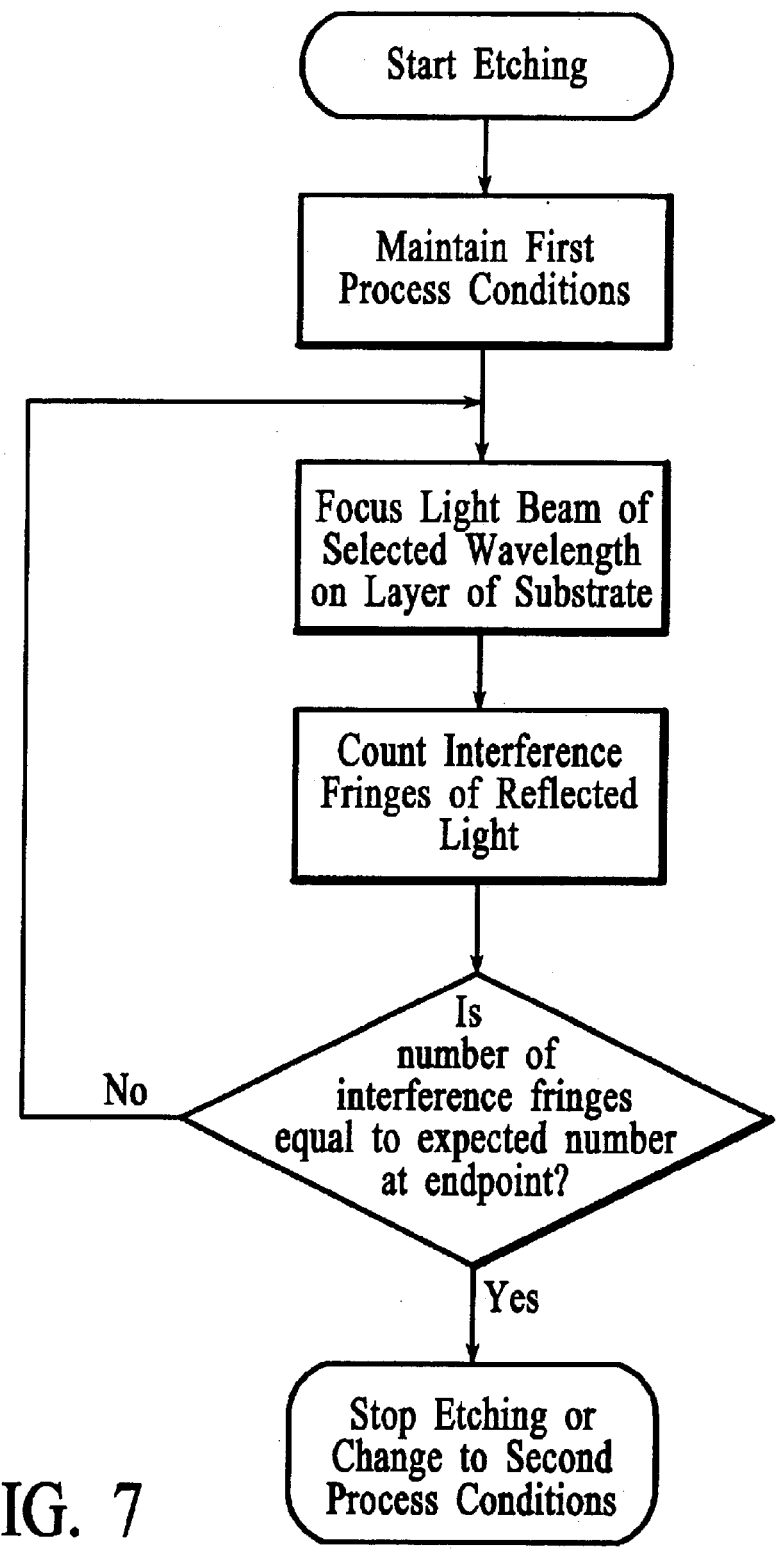
FIG. 7 is a flowchart of process steps used to etch a material of a substrate, detect an etching endpoint, and stop the etching process or change process conditions.

In the process of etching and endpoint detection, as represented by the flowchart of FIG. 7, the thickness of the first material 130 that is being etched is continuously measured. In one embodiment, etching proceeds to near completion, such as with about 300 Angstroms of the first material 130 remaining on the substrate 110, at which point the etching process is stopped, or alternatively at which point the first process conditions are changed to second process conditions to reduce the etch rate. The second process conditions provide a slower and thus more controlled etching of the first material 130, and increase etching selectivity ratio to promote etching of the first material 130 relative to the underlying material 122. The etch rate can be reduced by changing the composition of the etchant gas, such as by removing aggressive gases, lowering RF bias power levels, lowering the substrate temperature, etc.

The endpoint detection method described herein can be used to detect the thickness of the material 130 and controllably change process conditions after a given thickness of the first material 130 is reached. In etching processes, the endpoint detection method can be used to change the process gas composition to provide particular etch rates or etching selectivity ratios. The endpoint detection method may be used to detect the moment at which most of the first material 130 is etched so that the first process conditions can be changed to less aggressive or second process conditions, or vice versa, to obtain the desired change in etch rate, etching selectivity ratio, or a change in any other property of the etching process, for example, higher/lower etch rates or etching of an underlying layer 123 having a different composition. For example, the endpoint detection method can be used to stop the etching process after a first highly aggressive etching step, which provides high etch rates due to the presence of a fluorinated gas in the etchant gas, to determine the starting point for a second and less reactive etching step, which uses an etchant gas that is substantially absent the fluorinated gas to etch the remaining first material 130 at a slower etch rate to obtain more controlled etching.

Figure 8:
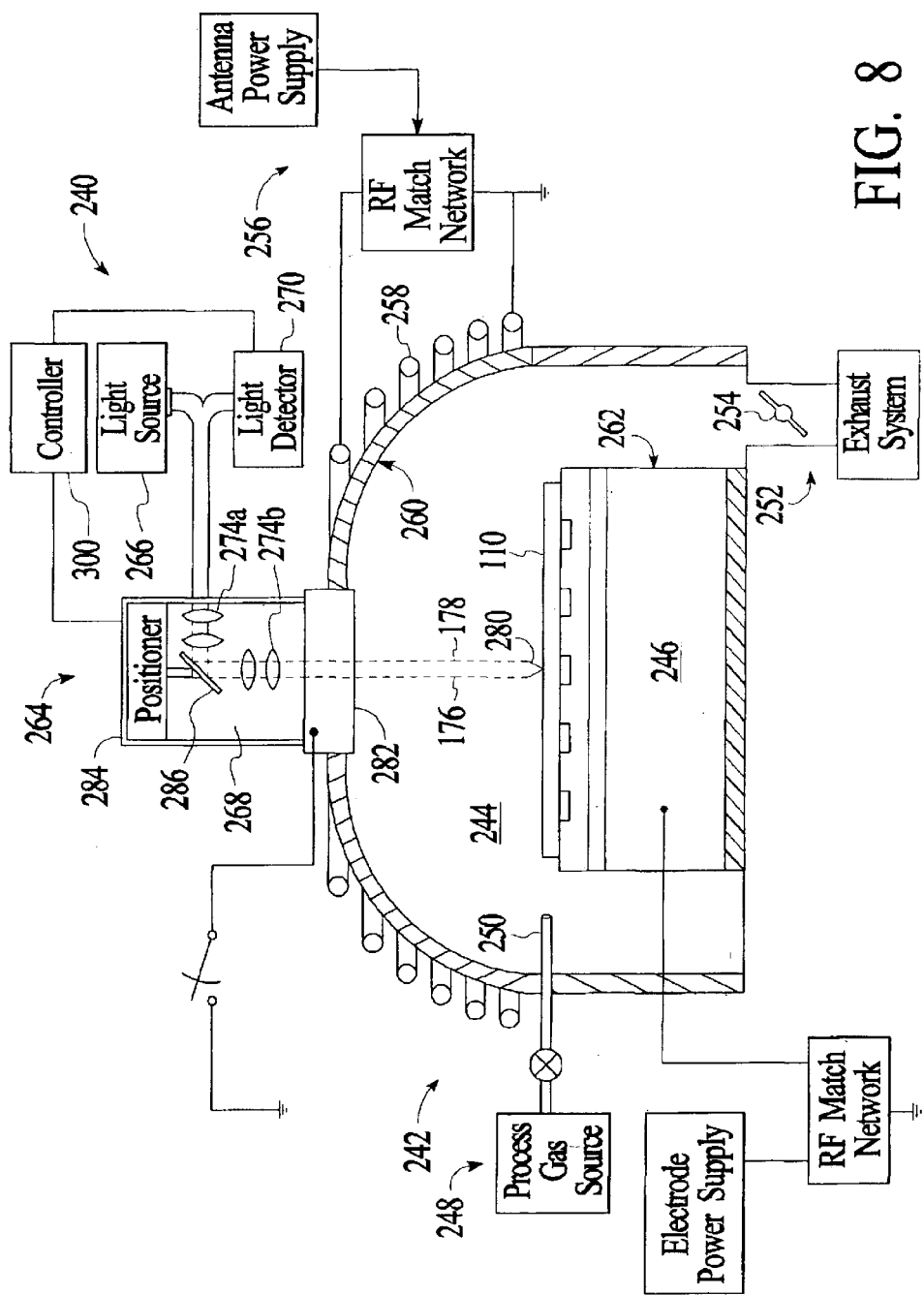
FIG. 8 is a schematic sectional side view of a substrate processing apparatus and endpoint detection system according to the present invention.

The substrate 110 is etched in a substrate processing apparatus 240, such as the embodiment schematically illustrated in FIG. 8, available from Applied Materials Inc., Santa Clara, Calif. The apparatus 240 comprises a process chamber 242 having a process zone 244 for processing the substrate 110, and a support 246 such as an electrostatic chuck that holds the substrate 110 in the process zone 244. The ceiling of the process chamber 242 can be flat or rectangular shaped, arcuate, conical, dome-shaped, or multi-radius dome-shaped. Preferably, the ceiling is dome-shaped to provide a uniform distribution of plasma source power across the entire volume of the process zone 244 and to provide a more uniform plasma ion density across the substrate surface than a flat ceiling.

The substrate 110 is transferred by a robot arm (not shown) from a load-lock transfer chamber (not shown) through a slit valve (not shown) and placed into a process zone 244 of the chamber 242. The substrate 110 is held on the support 246 by an electrostatic chuck and helium is supplied through apertures in the support 246 to control the temperature of the substrate 110. Thereafter, the process conditions in the process chamber 242 are set to process the material 130 of the substrate 110, the process conditions comprising one or more of process gas composition and flow rates, power levels of gas energizers, gas pressure, and substrate temperature. The process can also be performed in multiple stages, for example, each stage having different process conditions. For example, in an etching process, one or more compositions of process gas comprising etchant gas for etching the substrate 110 are introduced into the chamber 242 through the gas distributor. Suitable etchant gases for etching materials on the substrate 110 include, for example, chlorine-containing gases and fluorine-containing gases, such as fluorocarbons, and mixtures thereof. The chamber 242 is typically maintained at a pressure ranging from about 0.1 to about 400 mTorr. The etchant gas composition is selected to provide high etch rates and/or high etching selectivity ratios for etching the overlying dielectric material 130 relative to the underlying layer 122. When multiple layers are being sequentially etched, first, second, third, etchant gas compositions can be sequentially introduced into the chamber 242 to etch each particular layer.

Process gases, such as the etchant gases described herein, are introduced into the process zone 244 of the chamber 242 through a gas distributor 248 that includes a process gas source and a gas flow control system that comprises a gas flow control valve. The gas distributor 248 can comprise one or more gas outlets 250 located at or around the periphery of the substrate 110 (as shown), or a showerhead mounted on the ceiling of the chamber 242 with outlets therein (not shown). Spent process gas and etchant byproducts are exhausted from the process chamber 242 through an exhaust system 252 (typically including a roughing pump and a turbomolecular pump). A throttle valve 254 is provided in the exhaust system 252 to control the flow of spent process gas and the pressure of process gas in the chamber 242.

A plasma is generated from the process gas using a gas energizer 256 that energizes the process gas by coupling an electric field into the process zone 244 of the chamber 242, or into a remote zone adjacent to the process chamber 242. The plasma in the process zone 244 is maintained at first process conditions suitable for etching the dielectric material 130 of the substrate 110. A suitable gas energizer 256 comprises an inductor antenna 258 consisting of one or more inductor coils having a circular symmetry with a central axis coincident with the longitudinal vertical axis that extends through the center of the chamber 242 and is perpendicular to a plane of the substrate 110. When the inductor antenna 258 is positioned near the dome ceiling, the ceiling of the chamber 242 comprises dielectric material, such as aluminum oxide, which is transparent to RF fields and is also an electrical insulator material. The frequency of the RF voltage applied to the inductor antenna 258 is typically from about 50 kHz to about 60 MHz, and more typically about 13.56 MHz; and the RF power level applied to the antenna 258 is from about 100 to about 5000 Watts.

In addition to the inductor antenna 258, one or more process electrodes 260, 262 can be used to accelerate or energize the plasma ions in the chamber 242. The process electrodes 260, 262 include a ceiling or sidewalls of the chamber 242 that are electrically grounded or biased to serve as a first electrode 260 that capacitively couples with a second electrode 262 below the substrate 110, to form a capacitive electric field that generates or energizes the plasma in the chamber 242. Preferably, the first and second electrodes 260, 262 are electrically biased relative to one another by the electrode voltage supply that includes an AC voltage supply for providing a plasma generating RF voltage to the second electrode 262 and a DC voltage supply for providing a chucking voltage to the electrode 260. The AC voltage supply provides an RF generating voltage having one or more frequencies of from about 400 kHz to about 13.56 MHz at a power level of from about 50 to about 3000 Watts.

The process chamber 242 further comprises an endpoint detection system 264 that operates according to the above-described endpoint detection method for detecting an endpoint of a process being performed in the chamber 242. Generally, the endpoint detection system 264 comprises a light beam source 266 adapted to emit the incident light beam 176, and a light detector 270 that measures the intensity of the reflected light beam 178 from the substrate 110 to generate the reflected intensity signal 210. A focusing assembly 268 may optionally be included for focusing the incident light beam 176, onto the substrate 110. A controller 300 counts the number of interference fringes in the reflected light beam signal. The controller 300 may additionally or alternatively compare portions of the real-time measured reflection signal waveform to a stored characteristic waveform, or other representative pattern, and adjust process conditions in the process chamber 242 when the two waveforms have substantially the same shape.

The light source 266 comprises a monochromatic or polychromatic light source that generates an incident light beam 176 having an intensity sufficiently high to provide a reflected light beam 178 that is reflected from the substrate 110 with a measurable intensity. In one version, the light source 266 comprises the ambient plasma in the chamber 242. In another version, the light source 266 comprises a monochromatic light source that provides a selected wavelength of light, for example, a He—Ne or ND-YAG laser. In another version, the light source 266 provides polychromatic light, such as a xenon or Hg—Cd lamp. Optionally, the polychromatic light source 266 can be filtered to provide an incident light beam 176 having the selected wavelengths or color filters can be placed in front of the light detector 270 to filter out all undesirable wavelengths except the desired wavelengths of light, prior to measuring the intensity of the reflected light beam 178 entering the light detector 270. For example, the filters can be used to filter out wavelengths that are not in the desired wavelength bandwidth ($\Delta\lambda$), discussed above in order to attain the desired coherence length of the light beam 176 in the substrate 110. Typically, this light source 266 generates a coherent, ultraviolet light beam 176. For example, the light source 266 may be adapted to generate an emission spectrum of light in wavelengths of less than about 240 nm, such as from about 150 to about 220 nm.

One or more convex focusing lenses 274a, 274b are used to focus the incident light beam 176 from the light source 266 as a beam spot 280 onto the substrate 110 and to focus the reflected light beam 178 back on the active surface of the light detector 270. The size or area of the beam spot 280 should be sufficiently large to compensate for variations in surface topography of the substrate 110 to enable etching of high aspect ratio features having small openings, such as vias or deep and narrow trenches. The area of the reflected light beam 178 should be sufficiently large to activate a large portion of the active light detecting surface of the light detector 270. The incident and reflected light beams 176, 178 are directed through a transparent window 282 in the process chamber 242 that allows the light beams 176, 178 to pass in and out of the process zone 244.

Optionally, a light beam positioner 284 is used to move the incident light beam 176 across the substrate surface to locate a suitable portion of the dielectric material 130, and optionally also a suitable portion of the mask 115, on which to "park" the beam spot 280 to monitor the substrate processing. The light beam positioner 284 comprises one or more primary mirrors 286 that rotate at small angles to deflect the light beam 176 from the light source 266 onto different positions of the substrate 110 (as shown). Additional secondary mirrors can be used (not shown) to intercept the reflected light beam 178 that is reflected from the substrate 110 and focus the light beam 178 on the light detector 270. In another embodiment, the light beam positioner 284 is used to scan the light beam 176 in a raster pattern across the substrate surface. In this version, the light beam positioner 284 comprises a scanning assembly consisting of a movable stage (not shown) upon which the light source 266, focusing assembly 268, collecting lens, and detector 270 are mounted. The movable stage can be moved through set intervals by a drive mechanism, such as a stepper motor, to move the beam spot 280 across the substrate 110.

The light detector 270 comprises a light sensitive electronic component, such as a photomultiplier, photovoltaic cell, photodiode, or phototransistor, which provides an electrical signal in response to a measured intensity of the reflected light beam 178 that is reflected from the substrate

110. A signal filter (not shown) can be plated in front of the light detector 270. The signal can be in the form of a change in the level of a current passing through an electrical component or a change in a voltage applied across an electrical component. The reflected light beam 178 undergoes constructive and/or destructive interference which increases or decreases the intensity of the light beam 178, and the light detector 270 provides an electrical output signal in relation to the measured intensity of the reflected light beam 178.

Figure 9:
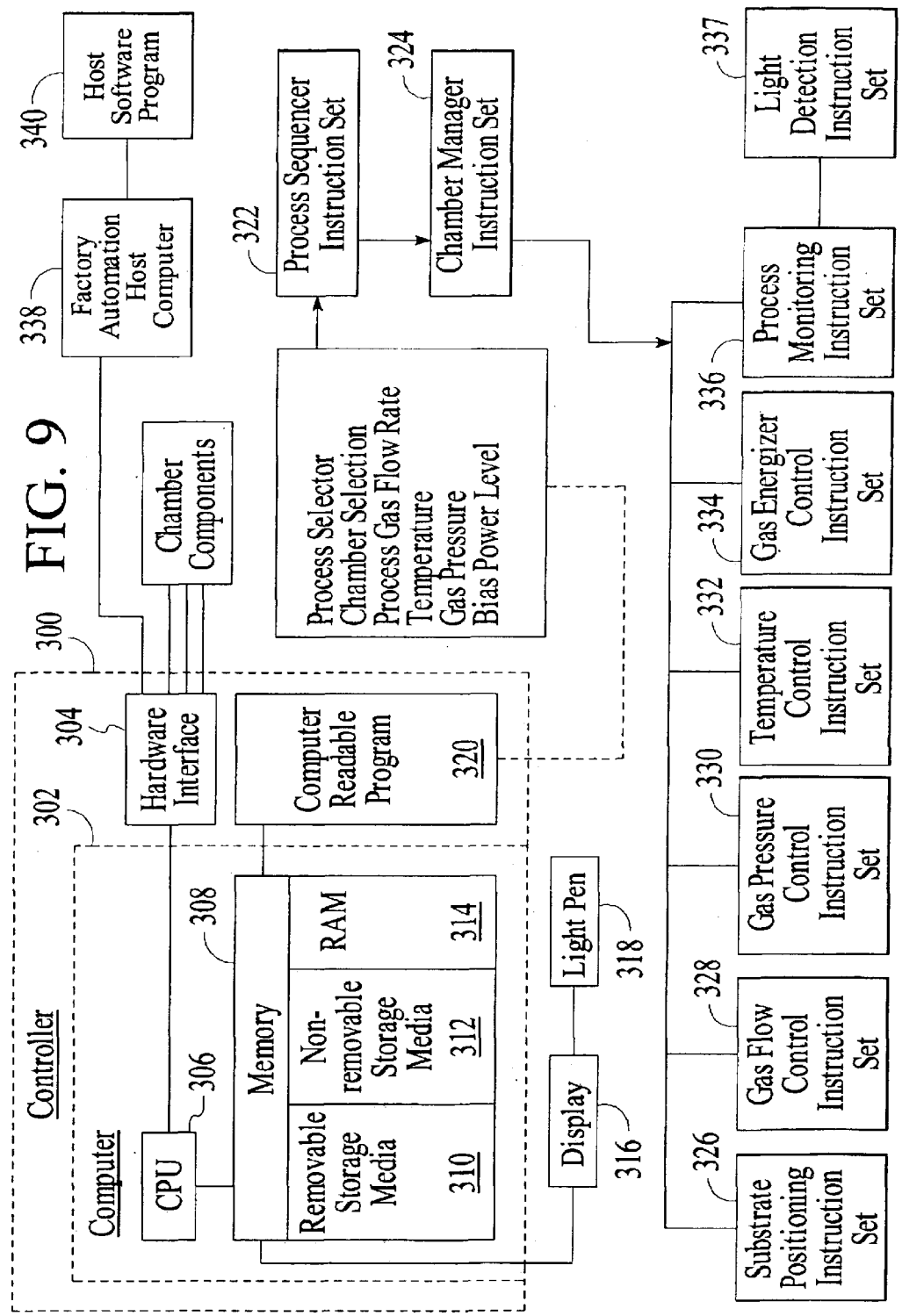
FIG. 9 is a schematic diagram of a controller of the substrate processing apparatus of FIG. 8.

The electrical signal generated by the light detector 270 is passed to a controller 300 for evaluation. An illustrative block diagram of an embodiment of the controller 300 and associated computer-readable program 320 is shown in FIG. 9. The controller 300 may comprise a plurality of interface cards including, for example, analog and digital input and output boards, interface boards, such as a hardware interface board 304, and motor controller boards. The controller 300 further comprises a central processing unit (CPU) 306, such as for example a 68040 microprocessor, commercially available from Synergy Microsystems, California, or a Pentium Processor commercially available from Intel Corporation, Santa Clara, Calif., that is coupled to a memory 308 and peripheral computer components, as shown in FIG. 9. Preferably, the memory 308 includes a removable storage media 310, such as for example a CD or floppy drive, a non-removable storage media 312, such as for example a hard drive, and random access memory 314. The interface between an operator and the controller 300 can be, for example, via a display 316 and a light pen 318. The light pen 318 detects light emitted by the display 316 with a light sensor in the tip of the light pen 318. To select a particular screen or function, the operator touches a designated area of a screen on the display 316 and pushes the button on the light pen 318. Typically, the area touched changes color, or a new menu is displayed, confirming communication between the user and the controller 300.

The computer-readable program 320 on the controller 300 calculates, in real time, the thickness of the dielectric material 130 remaining of the substrate 110 and accordingly adjusts the process conditions in the process chamber 242. The computer program typically counts the number of interference fringes in the intensity signal 210 of the reflected light beam 178 and, after a predetermined number of fringes are reached, alters process conditions in the chamber 242 according to programmed guidelines. The computer-readable program 320 can alternatively include program code to compare the shape of the reflection signal to a stored characteristic waveform, or other representative pattern, and determine the endpoint of the etching process when the monitored reflection signal matches the stored characteristic waveform or pattern.

The computer-readable program 320 may be stored in the memory 308, for example, on the non-removable storage media 312 or on the removable storage media 310. The computer-readable program 320 generally comprises process control software comprising program code to operate the chamber 242 and its components, process monitoring software to monitor the processes being performed in the chamber 242 safety systems software, and other control software. The computer-readable program 320 may be written in any conventional computer-readable programming language, such as for example, assembly language, C++, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of precompiled library routines. To execute the linked, compiled object code, the user invokes the object code, causing the CPU 306 to read and execute the code to perform the tasks identified in the program 320.

FIG. 9 also shows an illustrative block diagram of a hierarchical control structure of a specific embodiment of the computer-readable program 320. Using the light pen interface 318, a user may enter instructions into the computer-readable program 320 in response to menus or screens shown on the display 316. The computer-readable program 320 includes program code to control the substrate position, gas flow, gas pressure, temperature, RF power levels, and other parameters of a particular process, as well as code to monitor the chamber process. The process sets are predetermined groups of process parameters necessary to carry out specified processes. The process parameters are process conditions, including without limitations, gas composition, gas flow rates, temperature, pressure and gas energizer settings such as RF or microwave power levels.

The process sequencer instruction set 322 comprises program code to accept a chamber type and set of process parameters from the computer-readable program 320 and to control its operation. The sequencer program 322 initiates execution of the process set by passing the particular process parameters to a chamber manager instruction set 324 that controls multiple processing tasks in the process chamber 242. Typically, the chamber manager instruction set 324 includes a substrate positioning instruction set 326, a gas flow control instruction set 328, a gas pressure control instruction set 330, a temperature control instruction set 332, a gas energizer control instruction set 334, and a process monitoring instruction set 336. Typically, the substrate positioning instruction set 326 comprises program code for controlling chamber components that are used to load the substrate 110 onto the support 246 and optionally, to lift the substrate 110 to a desired height in the chamber 242. The gas flow control instruction set 328 comprises program code for controlling the flow rates of different constituents of the process gas. The gas flow control instruction set 328 controls the open/close position of gas flow control valves (not seen) to obtain the desired gas flow rate. The gas pressure control instruction set 330 comprises program code for controlling the pressure in the chamber 242 by regulating the opening size of the throttle valve 254 in the exhaust system 252 of the chamber 242. The gas energizer control instruction set 334 comprises program code for energizing a gas in the chamber 242. For example, the gas energizer control subroutine 334 may comprise code for setting the RF bias voltage power level applied to process electrodes in the chamber 242. Optionally, a temperature control instruction set may be used to control the temperature of the chamber components such as sections of the support 246.

The process monitoring instruction set 336 comprises code for monitoring a process in the chamber 242. In one version, the process monitoring instruction set 336 comprises a light detection instruction set 337 to control the light detector 270. For example, the light detection instruction set 337 may comprise code to set detection parameters of reflected light beam 178, such as ranges of wavelengths, or may comprise code to process a detected signal from the detection means. Additionally, the light detection instruction set 337 may comprise code which determines the endpoint of a process according to a parameter set input by the operator. For example, the detector 270 delivers a signal related to the intensity of the reflected light beam 178 to the controller 300. The light detection instruction set 337 contained in the controller 300 may process the reflection signal corresponding to the reflected light beam 178 as a function of time and wavelength. The endpoint of the chamber process may be determined by the light detection instruction set 337 once the intensity signal 210 has reached, for example, a predetermined level for a certain preselected amount of time. A signal is given by the light detection instruction set 337 to a factory automation host computer 338 to halt the chamber process or change the process conditions once the process endpoint has been reached.

The data signals received by and/or evaluated by the controller 300 may be sent to the factory automation host computer 338. The factory automation host computer 338 comprises a host software program 340 that evaluates data from several systems, platforms or chambers, and for batches of substrates 110 or over an extended period of time, to identify statistical process control parameters of (i) the processes conducted on the substrates 110 (ii) a property that may vary in a statistical relationship across a single substrate 110 or (iii) a property that may vary in a statistical relationship across a batch of substrates 110. The host software program 340 may also use the data for ongoing in-situ process evaluations or for the control of other process parameters. A suitable host software program comprises a WORKSTREAM™ software program available from aforementioned Applied Materials. The factory automation host computer 338 may be further adapted to provide instruction signals to (i) remove particular substrates 110 from the processing sequence, for example, if a substrate property is inadequate or does not fall within a statistically determined range of values, or if a process parameter deviates from an acceptable range; (ii) end processing in a particular chamber 242, or (iii) adjust process conditions upon a determination of an unsuitable property of the substrate 110 or process parameter. The factory automation host computer 338 may also provide the instruction signal at the beginning or end of processing of the substrate 110 in response to evaluation of the data by the host software program 340.

The present invention is described with reference to certain preferred versions thereof; however, other versions are possible. For example, the endpoint detection method of the present invention can be used to detect endpoint in deposition, cleaning, or other etching processes, as would be apparent to one of ordinary skill. For example, the method can be applied, as would be apparent to one of ordinary skill in the art, to detect endpoint in sputtering etch chambers, cleaning chambers, or deposition chambers. Therefore, the spirit and scope of the appended claims should not be limited to the description of the preferred versions contained herein.

What is claimed is:

1. A method of etching a substrate, the method comprising:
   (a) placing a substrate in a process zone, the substrate comprising a material having a thickness;
   (b) introducing an etchant gas into the process zone;
   (c) energizing the etchant gas to etch the material; and
   (d) determining an endpoint of etching the material by
      (i) reflecting a light beam from the substrate, the light beam having a wavelength selected to have a coherence length in the substrate of from about 1.5 to about 4 times the thickness of the material, and
      (ii) detecting the reflected light beam to determine an endpoint of the substrate etching process.

2. A method according to claim 1 further comprising selecting the wavelength to have a coherence length in the substrate of from about 2 to about 3 times the thickness of the material.

3. A method according to claim 1 comprising selecting the wavelength according to the approximate proportionality: coherence length $\alpha \lambda^2 / \Delta\lambda$, where $\lambda$ is the wavelength and $\Delta\lambda$ is the bandwidth of wavelengths in the light beam.

4. A method according to claim 1 wherein the material comprises exposed regions between features of a patterned mask, and further comprising selecting the wavelength to maximize an absorption differential that is a difference between the absorption of the light beam in the patterned mask and the absorption of the light beam in the material.

5. A method according to claim 1 comprising selecting the wavelength to be less than about 240 nm.

6. A method according to claim 5 comprising selecting the wavelength to be from about 150 to about 220 nm.

7. A method of etching a substrate, the method comprising:
   (a) placing a substrate in a process zone, the substrate comprising a material with exposed regions between features of a patterned mask;
   (b) introducing an etchant gas into the process zone;
   (c) energizing the etchant gas to etch the material; and
   (d) determining an endpoint of etching the material by
      (i) reflecting a light beam from the substrate, the light beam having a wavelength selected to maximize an absorption differential that is a difference between the absorption of the light beam in the patterned mask and the absorption of the light beam in the material, and
      (ii) detecting the reflected light beam to determine an endpoint of the substrate etching process.

8. A method according to claim 7 wherein the patterned mask has an absorption coefficient and a thickness, and comprising selecting the wavelength according to the absorption coefficient and thickness of the mask to maximize the absorption differential.

9. A method according to claim 7 comprising selecting the wavelength to be less than about 240 nm.

10. A method according to claim 9 comprising selecting the wavelength to be from about 160 to about 220 nm.

11. A method according to claim 7 further comprising selecting the wavelength to have a coherence length in the substrate of from about 1.5 to about 4 times a thickness of the material.

* * * * *